(12) United States Patent
Mohapatra et al.

(10) Patent No.: US 10,483,353 B2
(45) Date of Patent: Nov. 19, 2019

(54) TRANSISTOR INCLUDING TENSILE-STRAINED GERMANIUM CHANNEL

(71) Applicant: INTEL CORPORATION, Santa Clara, CA (US)

(72) Inventors: Chandra S. Mohapatra, Hillsboro, OR (US); Glenn A. Glass, Portland, OR (US); Anand S. Murthy, Portland, OR (US); Karthik Jambunathan, Hillsboro, OR (US); Willy Rachmady, Beaverton, OR (US); Gilbert Dewey, Beaverton, OR (US); Tahir Ghani, Portland, OR (US); Jack T. Kavalieros, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/778,863

(22) PCT Filed: Dec. 24, 2015

(86) PCT No.: PCT/US2015/000414
§ 371 (c)(1),
(2) Date: May 24, 2018

(87) PCT Pub. No.: WO2017/111848
PCT Pub. Date: Jun. 29, 2017

(65) Prior Publication Data
US 2018/0358440 A1    Dec. 13, 2018

(51) Int. Cl.
*H01L 29/78* (2006.01)
*H01L 29/10* (2006.01)
(Continued)

(52) U.S. Cl.
CPC .. *H01L 29/1054* (2013.01); *H01L 21/823821* (2013.01); *H01L 27/0924* (2013.01);
(Continued)

(58) Field of Classification Search
CPC .. H01L 29/1054; H01L 29/785; H01L 27/092
See application file for complete search history.

(56) References Cited

U.S. PATENT DOCUMENTS

2008/0237636 A1* 10/2008 Jin ................. H01L 29/1054
257/190
2013/0039664 A1 2/2013 Clifton et al.
(Continued)

FOREIGN PATENT DOCUMENTS

| EP | 0683522 A2 | 11/1995 |
| WO | 2015/099692 A1 | 7/2015 |
| WO | 2017/111848 A8 | 6/2017 |

OTHER PUBLICATIONS

International Search Report and Written Opinion received for PCT Application No. PCT/US2015/000414, dated Oct. 31, 2016. 12 pages.
(Continued)

*Primary Examiner* — Thomas L Dickey
(74) *Attorney, Agent, or Firm* — Finch & Maloney PLLC

(57) ABSTRACT

Techniques are disclosed for forming transistor structures including tensile-strained germanium (Ge) channel material. The transistor structures may be used for either or both of n-type and p-type transistor devices, as tensile-strained Ge has very high carrier mobility properties suitable for both types. Thus, a simplified CMOS integration scheme may be achieved by forming n-MOS and p-MOS devices included in the CMOS device using the techniques described herein. In some cases, the tensile-strained Ge may be achieved by epitaxially growing the Ge material on a group III-V material having a lattice constant that is higher than that of Ge
(Continued)

and/or by applying a macroscopic 3-point bending to the die on which the transistor is formed. The techniques may be used to form transistors having planar or non-planar configurations, such as finned configurations (e.g., finFET or tri-gate) or gate-all-around (GAA) configurations (including at least one nanowire).

19 Claims, 8 Drawing Sheets

(51) Int. Cl.
H01L 21/8238 (2006.01)
H01L 29/423 (2006.01)
H01L 29/66 (2006.01)
H01L 29/739 (2006.01)
H01L 27/092 (2006.01)
H01L 29/786 (2006.01)

(52) U.S. Cl.
CPC .. *H01L 29/42392* (2013.01); *H01L 29/66356* (2013.01); *H01L 29/66545* (2013.01); *H01L 29/66795* (2013.01); *H01L 29/7391* (2013.01); *H01L 29/785* (2013.01); *H01L 29/78696* (2013.01)

(56) References Cited

U.S. PATENT DOCUMENTS

2013/0240836 A1 9/2013 Lee et al.
2015/0279947 A1 10/2015 Waldron et al.

OTHER PUBLICATIONS

International Preliminary Report on Patentability received for PCT Application No. PCT/US2015/000414, dated Jun. 26, 2018. 8 pages.

* cited by examiner

TRANSISTOR INCLUDING TENSILE-STRAINED GERMANIUM CHANNEL

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers flow from the source to the drain. Some FETs have a fourth terminal called, the body or substrate, which serves to bias the transistor into operation. A metal-oxide-semiconductor FET (MOSFET) uses an insulator between the gate and the body of the transistor and MOSFETs can be used for amplifying or switching electronic signals. MOSFETs are commonly found in both digital and analog circuits. MOSFETs typically include side-wall spacers, referred to generally as spacers, on either side of the gate that help determine the channel length and help with replacement gate processes, for example. Complementary MOS (CMOS) structures typically use a combination of p-type MOSFETs (p-MOS) and n-type MOSFETs (n-MOS) to implement logic gates and other digital circuits.

A finFET is a transistor built around a thin strip of semiconductor material (generally referred to as a fin). The transistor includes the standard FET nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a finFET design is sometimes referred to as a tri-gate transistor. FinFETs are referred to as non-planar transistor configurations, and other types of non-planar configurations are also available, such as so-called double-gate transistor configurations, in which the conductive channel principally resides only along the two sidewalls of the fin (and not along the top of the fin). Another non-planar transistor configuration is a gate-all-around configuration, which is configured similarly to a fin-based transistor, but instead of a finned channel region where the gate is on three portions (and thus, there are three effective gates), one or more nanowires (or nanoribbons) are used and the gate material generally surrounds each nanowire.

Figure 1A:
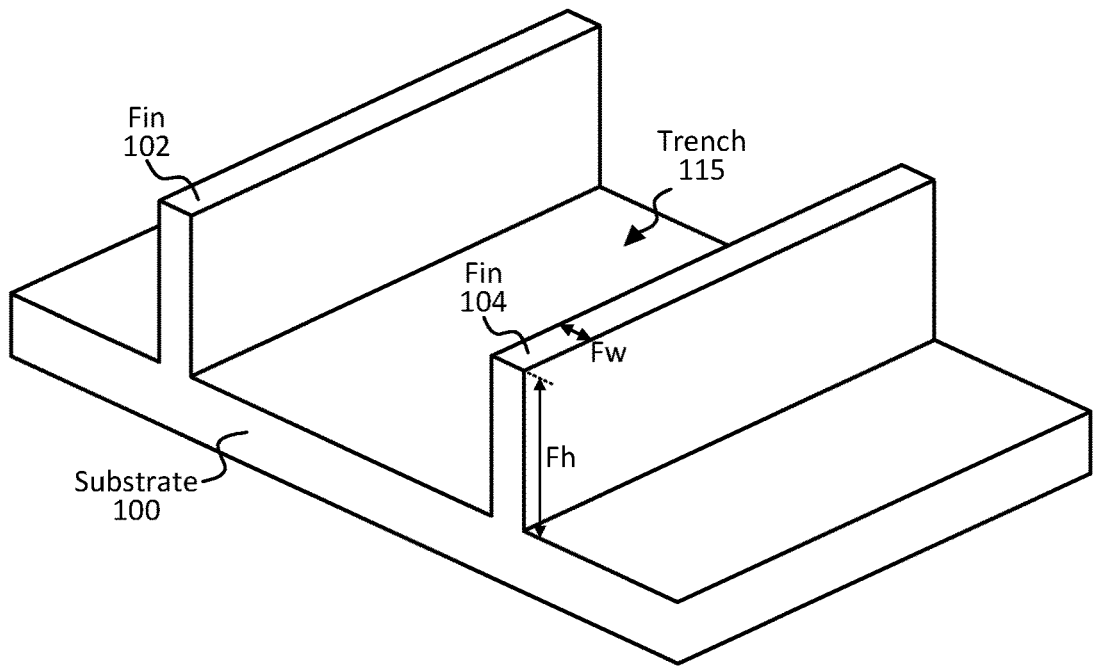
FIGS. 1A-I illustrate example integrated circuit structures resulting from a method configured to form transistors including tensile-strained germanium (Ge) channel material, in accordance with some embodiments of this disclosure. Note that FIG. 1I is a cross-sectional view taken along plane A of FIG. 1H, in accordance with some embodiments. Also note that FIGS. 1C' and 1C" illustrate example alternative trench bottom shapes that may be formed, in accordance with some embodiments. Further note that FIGS. 1D', and 1F', are provided to illustrate example structures that may be used to form a transistor including a gate-all-around configuration, in accordance with some embodiments.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming transistor structures including tensile-strained germanium (Ge) channel material. The transistor structures may be used for either or both of n-type and p-type transistor devices, as tensile-strained Ge has very high carrier mobility properties suitable for both types. Thus, a simplified CMOS integration scheme may be achieved by forming n-MOS and p-MOS devices included in the CMOS device using the techniques described herein. In some cases, the tensile-strained Ge may be achieved by epitaxially growing the Ge material on a group III-V material having a lattice constant that is higher than that of Ge, such as a buffer layer or a strain-relaxed buffer (SRB) layer of indium gallium arsenide. In some such cases, the epitaxial growth may be performed in a narrow trench to employ aspect ratio trapping (ART) to address defects formed as a result of the lattice mismatch between the materials used in epitaxial heterostructure. In some cases, the techniques may be used to form transistors including planar or non-planar configurations. For instance, the techniques may be used to form a transistor including a finned configuration (e.g., a finFET or tri-gate transistor configuration) and such techniques may include forming a pseudomorphic conduction band offset (CBO) material layer under the active Ge channel layer to, for example, assist with or eliminate sub-fin leakage. In some cases, the techniques may be used to form a transistor including a gate-all-around (GAA) configuration (including at least one nanowire) and such techniques may include a macroscopic 3-point bending of the die on which the transistor is formed to recover strain lost as a result of the removal of the sub-Ge channel material to form the at least one nanowire. Numerous configurations and variations will be apparent in light of this disclosure.

General Overview

Achieving CMOS integration schemes in fabricating integrated circuits has become a challenge when moving from silicon (Si) channel materials to alternate channel materials, such as germanium (Ge), SiGe, and III-V materials. Moving to alternate channel materials is important for keeping up with Moore's law. However, CMOS integration schemes that use different channel material for n-MOS and p-MOS leads to complex integration challenges. For example, such integration includes additional processing for the different material channel regions, such as patterning the intended channel regions of one set of structures (e.g., n-MOS/p-MOS structures) while processing the intended channel regions of the other set of structures (e.g., p-MOS/n-MOS structures), and vice versa to process the originally patterned set. This additional processing adds cost and complexity to CMOS fabrication.

Thus, and in accordance with one or more embodiments of the present disclosure, techniques are provided for forming transistor structures including tensile-strained germanium (Ge) channel material. In some embodiments, the transistor structures including tensile-strained Ge channel material may be used for either or both of n-MOS and p-MOS transistors, as tensile-strained Ge has very high carrier mobility properties that are suitable for both n and p-type devices. For example tensile-strained Ge has an electron mobility of at least approximately 12,000 cm$^2$/(V*s) and a hole mobility of at least approximately 20,000 cm$^2$/(V*s). Thus, in some embodiments, a simplified CMOS integration scheme may be achieved by forming included n-MOS and p-MOS transistors using the techniques described herein (e.g., with tensile-strained Ge channel material). In some such embodiments, the channel region processing may be the same for both n-type and p-type transistors (which would be formed on the same die or substrate, in some embodiments), and the only difference in processing the two types of transistors may be the source/drain processing, for example. In some embodiments, tensile-strained Ge may be achieved by epitaxially growing the Ge material on a material having a lattice constant that is higher than that of Ge, such as a strain-relaxed buffer (SRB) of indium gallium arsenide ($In_xGa_{1-x}As$), to provide an example material. In some such embodiments, the epitaxial growth may be performed in a narrow trench to employ aspect ratio trapping (ART) to address defects formed as a result of the lattice mismatch between the materials used in epitaxial heterostructure, for example. Further, in some such embodiments, the ART scheme can be used to contain such lattice defects (e.g., misfit dislocations, stacking faults, and so forth) to the bottom of the narrow trench, for example.

In some embodiments, the techniques may be used to form transistors including planar or non-planar configurations. For instance, in some embodiments, the techniques may be used to form a transistor including a finned configuration (e.g., a finFET or tri-gate transistor configuration). In some such embodiments, a pseudomorphic (e.g., lower than the critical thickness of the material) conduction band offset (CBO) material layer may be included under the active Ge channel layer to, for example, assist with or eliminate sub-fin leakage. In some embodiments, the techniques may be used to form a transistor including a gate-all-around (GAA) configuration (e.g., a nanowire or nanoribbon transistor configuration). In some such embodiments, the sub-fin may be released which may cause the tensile strain in the Ge channel region (e.g., due to the epitaxial heterostructure) to be lost. In some such embodiments, the tensile strain may be recovered in the Ge channel region using a macroscopic 3-point bending of the die on which the transistor is formed, which may be performed, for example, at the end-of-line (EOL) or packaging portion of the fabrication process. In some such embodiments, the 3-point bending techniques may include application of pressure (e.g., in the range of 1 to 5 MPa) during the packaging process to create a radius of curvature to the die. Further, in some such embodiments, the direction of curvature may be selected such that the fins or nanowires/nanoribbons are put in tension or compression as desired to increase the carrier mobility for the species of interest. Further, in some such embodiments, the bending is preserved or memorized in the packaging material for the life of the device.

Numerous benefits will be apparent in light of this disclosure. For example, in some embodiments, the techniques can be used to form a transistor including a tensile-strained Ge channel, which has very high carrier mobility for both n-type and p-type transistors. Thus, in some such embodiments, a simpler (e.g., less processes, lower cost, and so forth) CMOS integration scheme can be achieved, as the tensile-strained Ge channel is suitable for both n-MOS and p-MOS. In some embodiments, the replacement fin heteroepitaxial stack (including sub-fin and channel material) may be grown in-situ to curtail the adverse effects of air-break and/or planarization, and to keep the channel interface clean (e.g., better surface quality), for example. In some embodiments, the techniques help in achieving higher performance transistors. For instance, in some embodiments, higher transistor performance may be achieved by reducing or eliminating off-state leakage current. Further, in some embodiments, an ART scheme may be employed by forming a replacement material fin stack in a sufficiently narrow fin trench to contain lattice defects to the bottom of the trench. In some embodiments, the techniques may be used to form transistors of varying types, configurations, and geometries, such as p-type MOSFET (p-MOS), n-type MOSFET (n-MOS), p-type tunnel FET (p-TFET), n-type TFET (n-TFET), complementary MOS (CMOS), complementary TFET (CTFET) devices, planar configurations, dual-gate configurations, finned configurations (e.g., finFET or tri-gate), or gate-all-around configurations (e.g., including one or more nanowires/nanoribbons), for example.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with a tensile-strained Ge material channel. In some such embodiments, where the structure includes a finned configuration, the tensile-strained Ge material channel may be formed above and/or on one or more group III-V material layers, such as a strain-relaxed buffer (SRB) layer (e.g., having a higher lattice constant than that of Ge material), a pseudomorphic layer (e.g., having a conduction band offset with respect to the Ge material of at least 0.25 meV), and/or a nucleation layer (e.g., formed at the bottom of the trench). In some embodiments, the strain in the tensile-strained Ge material channel may be evaluated using nano-beam TEM, and such strain may appear uni-axial in the case of fins and bi-axial in the case of a film, for example. In some embodiments, strain may be measured using an e-test signal, as the strained Ge material would produce an e-test signal of higher mobility compared to unstrained Ge material, for example.

In some embodiments, where the structure includes a gate-all-around configuration, one or more tensile-strained Ge material nanowires/nanoribbons may be located at the channel region. In some such embodiments, a sub-fin portion of a finned structure may be released to form the one or more nanowires/nanoribbons, and the strain in the Ge material may be lost and then at least partially recovered using a macroscopic 3-point bending process as described herein. In some embodiments, the tensile strain in the Ge nanowires/nanoribbons may be observed by testing whether the packaging includes a radius of curvature element (e.g., as a result of the 3-point bending process). This may include taking a cross section of the package and looking for a non-planar die-in-package. In such cases, the strain can be calculated by knowing the radius of curvature and the thickness of the beam element, for example. Even in the absence of packaging, the strain may be inferred based on geometry and known elastic constants of the features and materials of the structure, for example. Nevertheless, the mobility enhancement of a strained Ge device can be observed using an e-test compared to an unstrained Ge device, for example. In some embodiments, the techniques described herein used to form a transistor having a gate-all-around configuration may result in unused or dummy fins on the same die as the transistor being formed, where such unused fins include the tensile-strained Ge material formed on one or more group III-V material layers, for example. In other words, in embodiments including a GAA transistor configuration, the techniques may leave remnants of the replacement fin structures used to form tensile-strained Ge nanowires, and such remnants may be located on the same substrate/die/chip, for example. In some such embodiments, the remnants may include a finned structure formed on, in, and/or above the shared substrate/die/chip (shared with a GAA transistor formed using the techniques described herein), where the finned structure still includes one or more sacrificial group III-V material layers. In some embodiments, the techniques described herein may be detected by measuring the benefits achieved, such as the simpler CMOS integration scheme and/or the improvement in off-state current leakage, for example. Numerous configurations and variations will be apparent in light of this disclosure.

Methodology and Architecture

FIGS. 1A-I illustrate example integrated circuit structures resulting from a method configured to form transistors including tensile-strained germanium channel material, in accordance with some embodiments of this disclosure. Note that the integrated circuit structures in the example embodiments of FIGS. 1A-I are primarily depicted in the context of forming transistors having a finned configuration (e.g., finFET or tri-gate configuration). In some embodiments, the techniques disclosed herein can be used to form transistors having other configurations, such as a planar configuration, a dual-gate configuration, a gate-all-around configuration (e.g., as will be described in more detail with reference to FIGS. 2A-C), or any other suitable configuration depending on the end use or target application. Further, in some embodiments, the techniques can be used to form p-type and/or n-type transistor devices, such as p-type MOSFET (p-MOS), n-type MOSFET (n-MOS), p-type tunnel FET (p-TFET), or n-type TFET (n-TFET). Further yet, in some embodiments, the techniques may be used to benefit either or both of p-type and n-type transistors included in complementary MOS (CMOS) or complementary TFET (CTFET) devices, for example. Further still, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

FIG. 1A illustrates an example structure including substrate 100 having fins 102 and 104 formed therefrom, in accordance with an embodiment. In some embodiments, fins 102 and 104 may be formed using any suitable techniques, such as one or more patterning and etching processes, for example. In some cases, the process of forming fins 102 and 104 may be referred to as shallow trench recess, for example. In this example embodiment, fins 102 and 104 are formed from substrate 100, but in other embodiments, fins may be formed on substrate 100 (e.g., using any suitable deposition/growth and patterning techniques). FIG. 1A also shows trench 115 formed between fins 102 and 104, in this example embodiment. In some embodiments, the fins may be formed to have varying widths Fw and heights Fh. For example, in an aspect ratio trapping (ART) scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h:w) of the fins may be greater than 1, such as greater than 1.5, 2, or 3, or any other suitable minimum ratio, for example. Note that although only two fins are shown in the example structure of FIG. 1A for illustrative purposes, any number of fins may be formed, such as one, five, ten, hundreds, thousands, millions, and so forth, depending on the end use or target application.

In some embodiments, substrate 100 may include: a bulk substrate including a group IV material or compound, such as silicon (Si), germanium (Ge), silicon carbide (SiC), or SiGe and/or at least one group III-V compound and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group III-V compounds/materials include at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and so forth. Note that the use of group III-V to describe the material of a layer, feature, or structure is used to indicate that the layer, feature, or structure includes at least one group III-V material, but may also include other materials, such as one or more dopant materials, as will be apparent in light of the present disclosure. The original thickness or height of substrate 100 may be in the range of 50 to 950 microns, for example, or some other suitable thickness or height. In some embodiments, substrate 100 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Figure 1B:
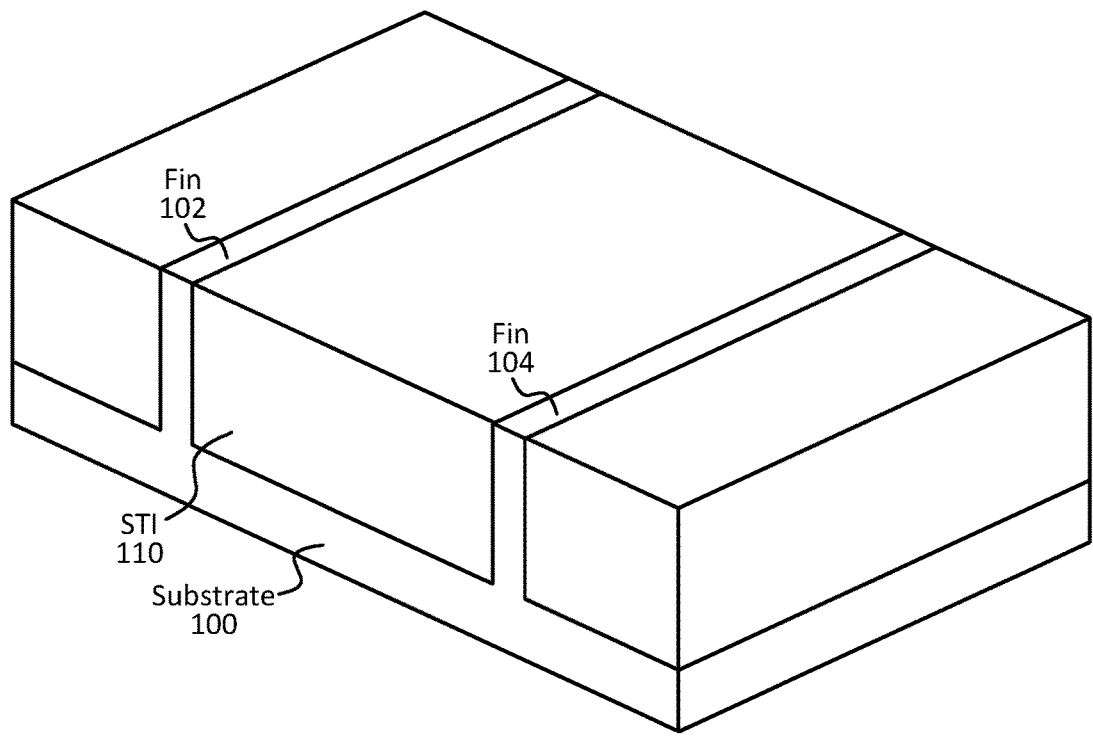

FIG. 1B illustrates an example structure formed after shallow trench isolation (STI) 110 processing has been performed in trenches 115 of the structure of FIG. 1A, in accordance with an embodiment. In some embodiments, STI processing may include any suitable techniques, such as deposition of the STI material followed by an optional planarization or polish process, for example. Any suitable deposition process may be used for the STI 110 deposition and the STI material may be selected based on the material of substrate 100 (e.g., to provide appropriate isolation and/or passivation), in some embodiments. For example, in the case of a Si substrate 100, STI material 110 may selected to be silicon dioxide or silicon nitride.

Figure 1C:
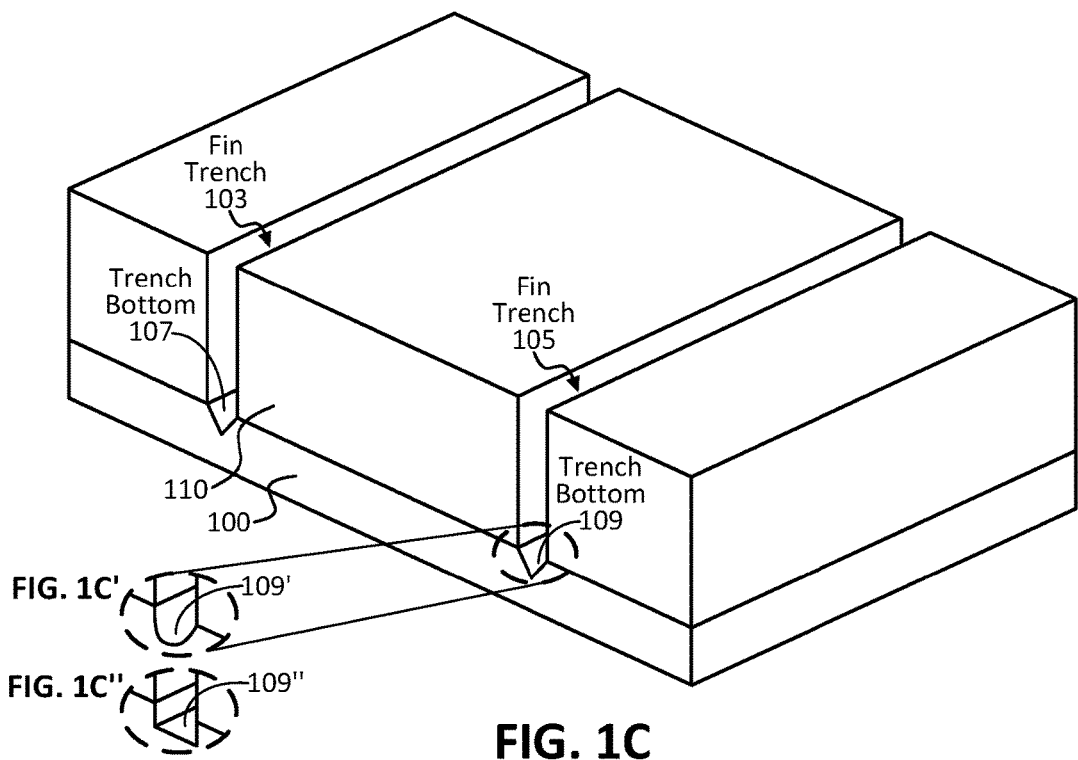

FIG. 1C illustrates an example structure formed after fins 102 and 104 have been etched out from the structure of FIG. 1B to form fin trenches 103 and 105, respectively, in accordance with an embodiment. In some embodiments, any suitable wet and/or dry etch processes may be used to form fin trenches 103 and 105, for example. In some such embodiments, the fin trenches 103 and 105 can include a desired or controlled size and shape, based on the size and shape of fins 102 and 104 and/or based on the conditions used during the etch to form trenches 103 and 105, for example. In the example structure of FIG. 1C, the bottom of the trenches 107 and 109 include faceting as shown, which can facilitate growth of subsequently deposited materials, as will be described in more detail herein. In this example embodiment, the faceting at the bottom of trenches 107 and 109 is shown as a {111} faceting, which includes a triangular shape at the bottom of the trench. In such an embodiment, the {111} faceting at the bottom of the trench may be used to facilitate the growth of the group III-V epitaxial materials, as will be described in more detail below. In some embodiments, any trench bottom geometry may be formed, such as a curved faceting 109' illustrated in FIG. 1C' or a flat bottom 109" illustrated in FIG. 1C", for example. In some embodiments, the geometry at trench bottoms 107 and 109 may be based on desired processing and/or real-world fabrication processes, for example.

Figure 1D:
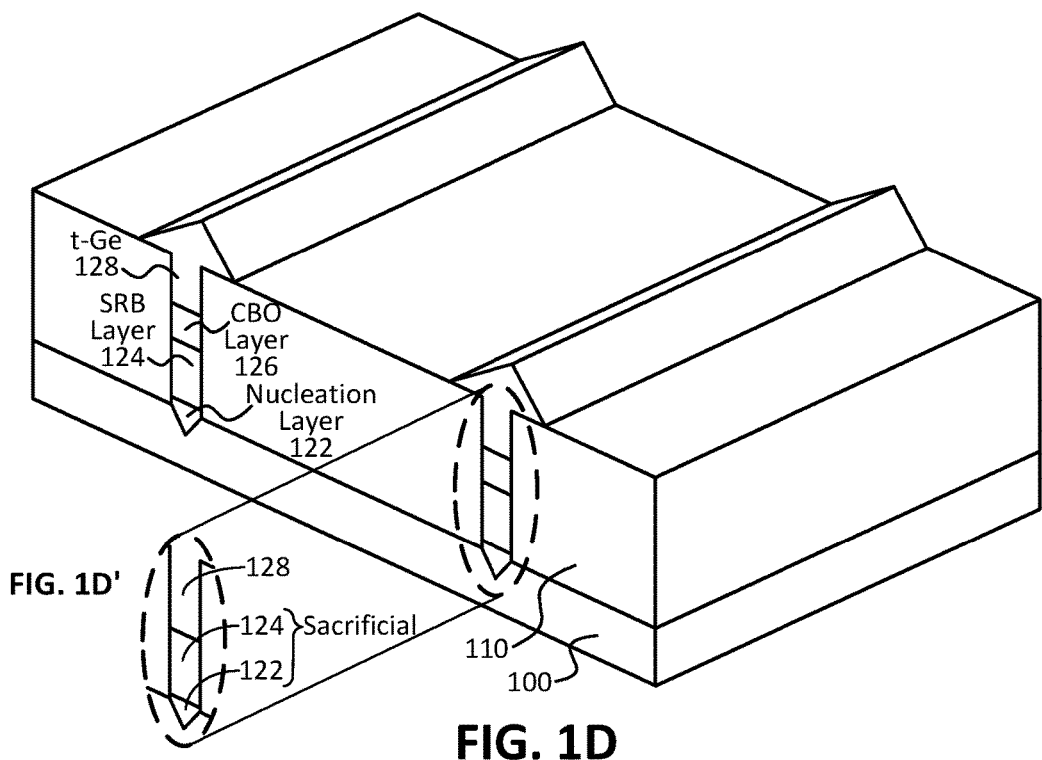

FIG. 1D illustrates an example structure formed after multiple materials have been deposited in fin trenches 103 and 105 of the structure of FIG. 1C, in accordance with an embodiment. In some embodiments, two or more material layers may be deposited in fin trenches 103 and 105. In some such embodiments, fin trenches 103 and 105 may be sufficiently narrow and/or sufficiently deep (e.g., with a height:width ratio of at least 2) for the deposition or epitaxial growth of the multi-layer structure to employ an ART scheme and to contain lattice defects (e.g., misfit dislocations, stacking faults, and so forth) to the very bottom of the trench. In some such embodiments, the use of narrow trenches 103 and 105 to employ an ART scheme can account for the lattice mismatch of the materials deposited therein. Further, in some such embodiments, employing an ART scheme minimizes or eliminates the lattice defects in the channel region, as can be understood based on this disclosure. In some embodiments, the deposition may be selective, such that it only or primarily (e.g., where at least 60, 70, 80, 90, or 95% of the material) grows in fin trenches 103 and 105, for example. In some such embodiments, some of the material may grow in other areas, such as on STI 110, for example. In this example embodiment, the materials deposited in fin trenches 103 and 105 include nucleation layer 122, strain-relaxed buffer (SRB) layer 124, conduction band offset (CBO) layer 126, and Ge-containing layer 128 (generally referred to herein as simply Ge layer 128). In some embodiments, nucleation layer 122 is optional (and thus, not present), as it may be deposited to wet the trench bottoms 103 and 105 (e.g., to wet the {111} faceted trenches), for example. In embodiments where nucleation layer 122 is present, it may include III-V material, such as indium phosphide (InP), gallium phosphide (GaP), gallium arsenide (GaAs), indium aluminum arsenide (InAlAs), aluminum gallium arsenide (AlGaAs), indium aluminum gallium arsenide (InAlGaAs), gallium arsenide antimonide (GaAsSb), and/or aluminum gallium phosphide (AlGaP), just to name some example materials. In some embodiments, nucleation layer 122, where present, may include material based on the material of substrate and/or the overlying layer (e.g., SRB layer 124).

In the example embodiment of FIG. 1D, SRB layer 124 is deposited or grown on nucleation layer 122. In embodiments where nucleation layer is not included, SRB layer 124 may be deposited or grown directly on the bottom of fin trenches 103 and 105, for example. In some embodiments, SRB layer 124 may include III-V material, such as indium gallium arsenide ($In_xGa_{1-x}As$), indium arsenide (InAs), and/or GaAs, just to name a few example materials. In some embodiments, SRB layer 124 may include a lattice constant higher than that of Ge, which may be used to cause Ge layer 128 to be tensile-strained. In some embodiments, Ge layer 128 is deposited on SRB layer 124, as is shown in FIG. 1D', for example. In some such embodiments, the III-V material (e.g., of layers 124 and 122, where present) may be sacrificial to allow for the formation of one or more nanowires (and thus, gate-all-around transistor configurations), for example, as will be described in more detail with reference to FIGS. 2A-C. In some embodiments, layer 124 may simply be a buffer layer and not a strain-relaxed buffer layer. Therefore, in some embodiments, layer 124 may be identified by its material, for example, or other properties, as the absence of strain may be difficult to observe. However, the designation SRB or strain-relaxed buffer layer may be used herein for layer 124, for ease of description.

In some embodiments, such as the embodiment shown in FIG. 1D, a CBO layer 126 may be formed between the SRB layer 124 and Ge layer 128. In some such embodiments, CBO layer 126 may be formed to reduce sub-fin leakage, which may be beneficial for finned transistor configuration, for example. In some embodiments, the material of CBO layer 126 may be pseudomorphic and/or less than the critical thickness of the material. In some such embodiments, the pseudomorphic layer 126 may be grown sufficiently thin such that it conforms to the underlying material without forming misfit dislocations, for example. In some embodiments, the material of CBO layer 126 may have a CBO with respect to the Ge layer 128 of at least 0.1, 0.15, 0.2, 0.25, 0.3, or 0.35 meV, or any other suitable minimum value. In some embodiments, the material of CBO layer may have a higher band-gap than Ge, such as a material band-gap that is at least 0.5, 1, or 1.5 higher, or some other suitable minimum value. In some embodiments, the material of CBO layer 126 may include III-V material, such as InP, GaP, GaAs, InAlAs, AlGaAs, InAlGaAs, GaAsSb, and/or AlGaP, just to name a few example materials. In some embodiments, where present, CBO layer 126 may include the same material as nucleation layer 122, while in other embodiments, they may include different materials, depending on the end use or target application. In some embodiments, Ge-containing layer 128 includes Ge and may be undoped or minimally doped (e.g., doped with less than 5E17 carriers of either n or p-type). As can be understood based on this disclosure, in some embodiments, because layer 128 is deposited on a material having a higher lattice constant than Ge (e.g., layer 124 or layer 126), it causes Ge layer 128 to be tensile-strained. In the example embodiment of FIG. 1D, Ge layer 128 is illustrated as protruding off the STI 110 plane, which may occur as a result of the deposition or growth conditions, for example. In some embodiments, one or more of the layers included in the fin stack (e.g., one or more of layers 122, 124, 126, 128) may include grading (e.g., increasing and/or decreasing) the content of one or more materials in the layer. Further, in some embodiments, one or more of the layers included in the fin stack may be a multi-layer structure including at least two material layers, depending on the end use or target application.

Figure 1E:
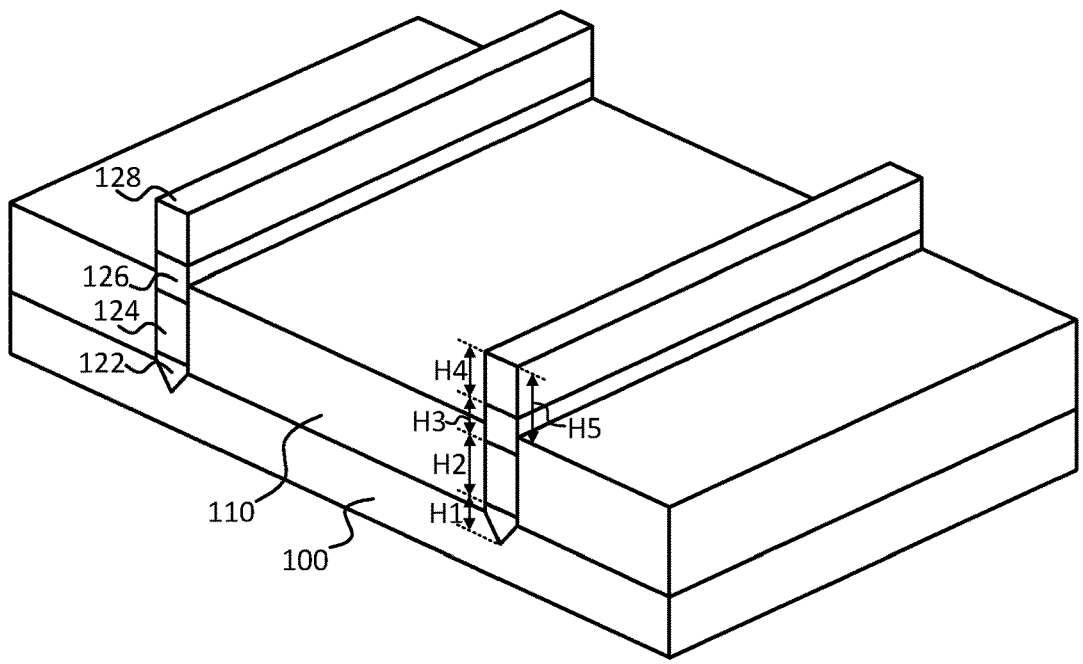

FIG. 1E illustrates an example structure formed after STI 110 material of the structure of FIG. 1D has been recessed, in accordance with an embodiment. In some embodiments, recessing STI 110 material may be performed using any suitable techniques. In some such embodiments, a polish or planarization process may have been performed prior to recessing STI material 110. In this example embodiment, STI 110 material was recessed such that the CBO layer 126 is within the active fin height H5 (the height of the portion of the fin that is above the STI plane); however, in other embodiments, the STI 110 material may be recessed to a different depth. In some cases, the CBO layer 126 may be a part of the active fin height to provide a conduction band offset benefit to the Ge layer 128 (e.g., as Ge layer 128 will be used as the transistor channel). In some embodiments, nucleation layer 122 may have a height H1 in the range of 10-50 nm (e.g., 15-30 nm), or any other suitable height, depending on the end use or target application. In some embodiments, SRB layer 124 may have a height H2 in the range of 25-150 nm (e.g., 50-100 nm), or any other suitable height, depending on the end use or target application. In some embodiments, CBO layer may have a height H3 in the range of 10-50 nm (e.g., 10-30 nm), or any other suitable height, depending on the end use or target application. In some embodiments, Ge layer 128 may have a height H4 in the range of 20-50 nm (e.g., 25-40 nm), or any other suitable height, depending on the end use or target application.

Figure 1F:
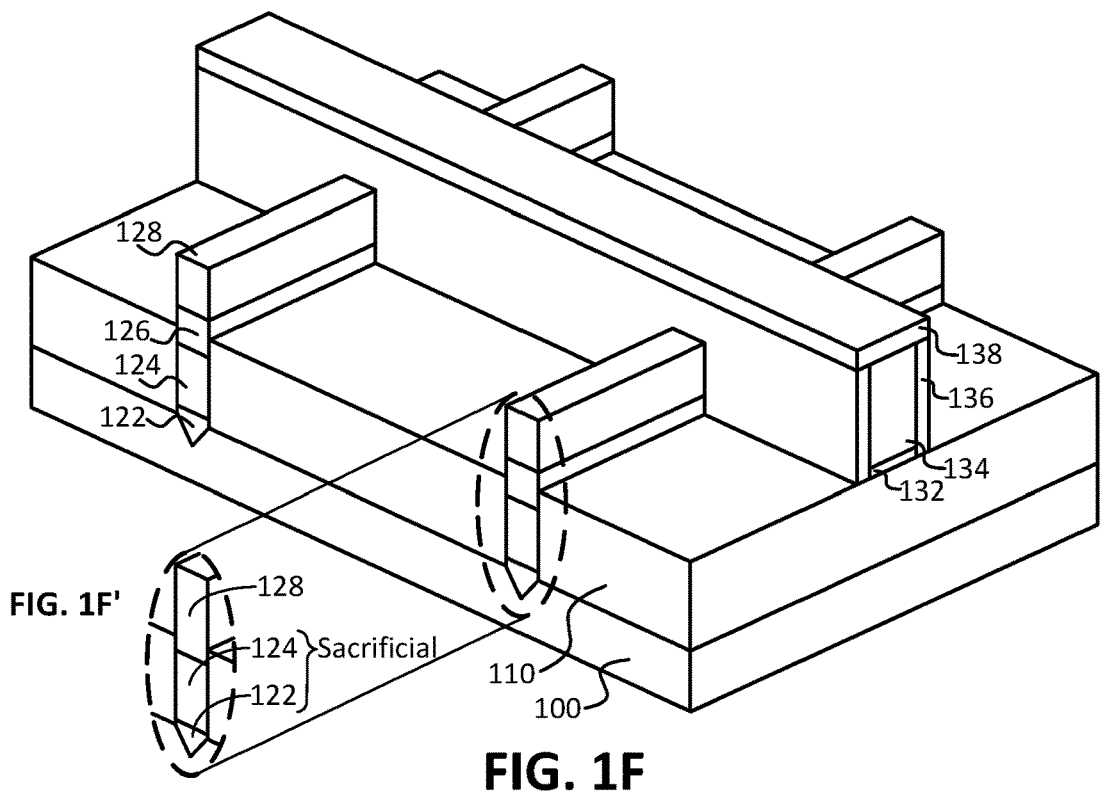

FIG. 1F illustrates an example structure formed after the gate stack has been formed on the structure of FIG. 1E, in accordance with an embodiment. In some embodiments, the gate stack including gate dielectric 132 and gate or gate electrode 134 may be formed as a final gate in, for example, a gate first process flow. In some such embodiments, the materials of the gate stack may be the same as gate stack including gate dielectric 172 and gate 174 described below. In some embodiments, gate dielectric 132 and gate 134 may be dummy material (e.g., dummy poly-silicon for the gate 134) used for a replacement gate process in, for example, a gate last process flow. In either case, formation of the gate stack may include depositing the gate dielectric material 132, gate or gate electrode material 134, patterning the gate stack, depositing gate spacer material 136, and performing a spacer etch to form the structure shown in FIG. 1F, for example. In this example embodiment, the fabrication process will be illustrated with a gate last process flow, where gate dielectric 132 and gate electrode 134 are dummy materials to be later removed. The example structure in this embodiment also includes hardmask 138 over the gate stack, which may be included to protect the gate stack during subsequent processing, for example. FIG. 1F' is provided to illustrate the example alternative fin of FIG. 1D', at this stage in the process flow.

Figure 1G:
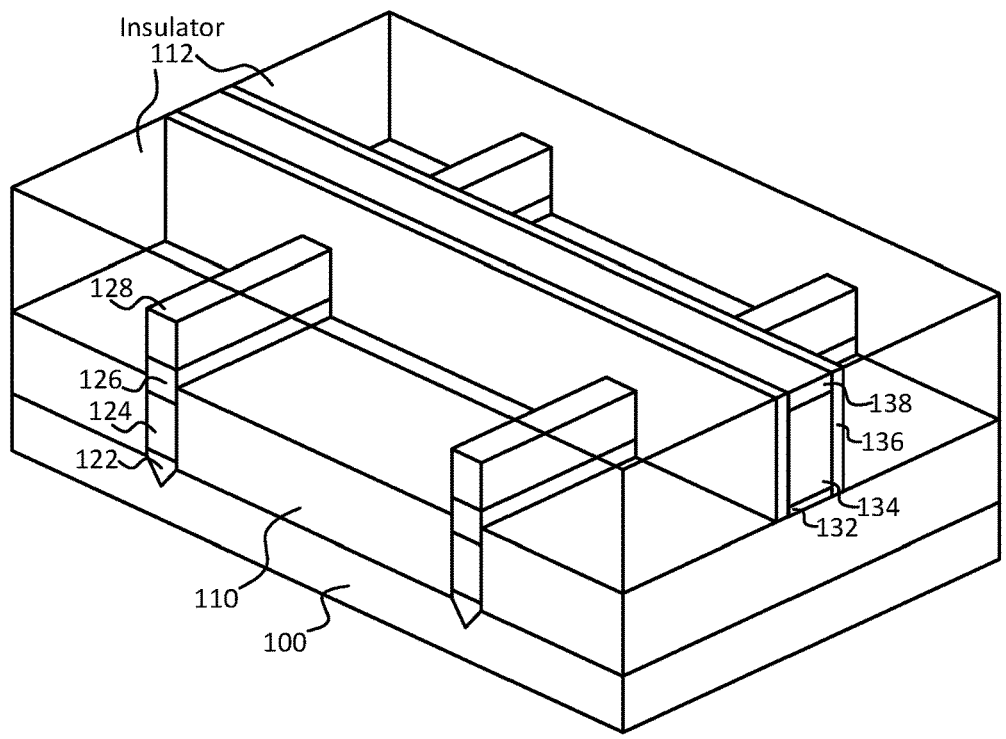

FIG. 1G illustrates an example structure formed after a layer of insulator material 112 has been formed on the structure of FIG. 1F, in accordance with an embodiment. Note that, in this example embodiment, insulator material 112 is illustrated as transparent to allow for underlying features to be seen. In some embodiments, the insulator material 112 may include a dielectric material, such as silicon dioxide, for example. In some embodiments, following deposition of the insulator material 112, a polish and/or planarization process may be performed to produce the example structure of FIG. 1G.

Figure 1H:
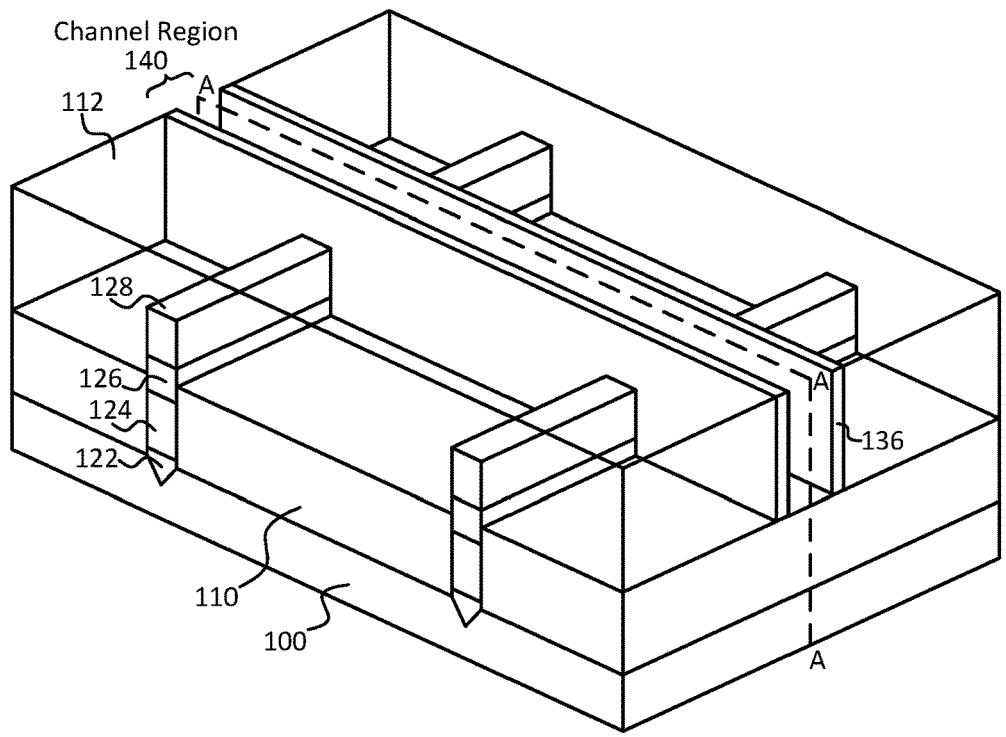

FIG. 1H illustrates an example structure formed after the dummy gate stack (including dummy gate dielectric 132 and dummy gate electrode 134) of FIG. 1G have been removed to re-expose the channel region 140, in accordance with an embodiment. In some embodiments, removing the dummy gate stack may include first removing hardmask layer 138 and then removing the dummy gate stack (layers 132 and 134, in this example case) using any suitable techniques, such as etches, polishes and/or cleaning processes, for example. The A plane in FIG. 1H is used to indicate the cross-sectional views of FIGS. 1I and 2A-C, as will be described in more detail below.

Figure 1I:
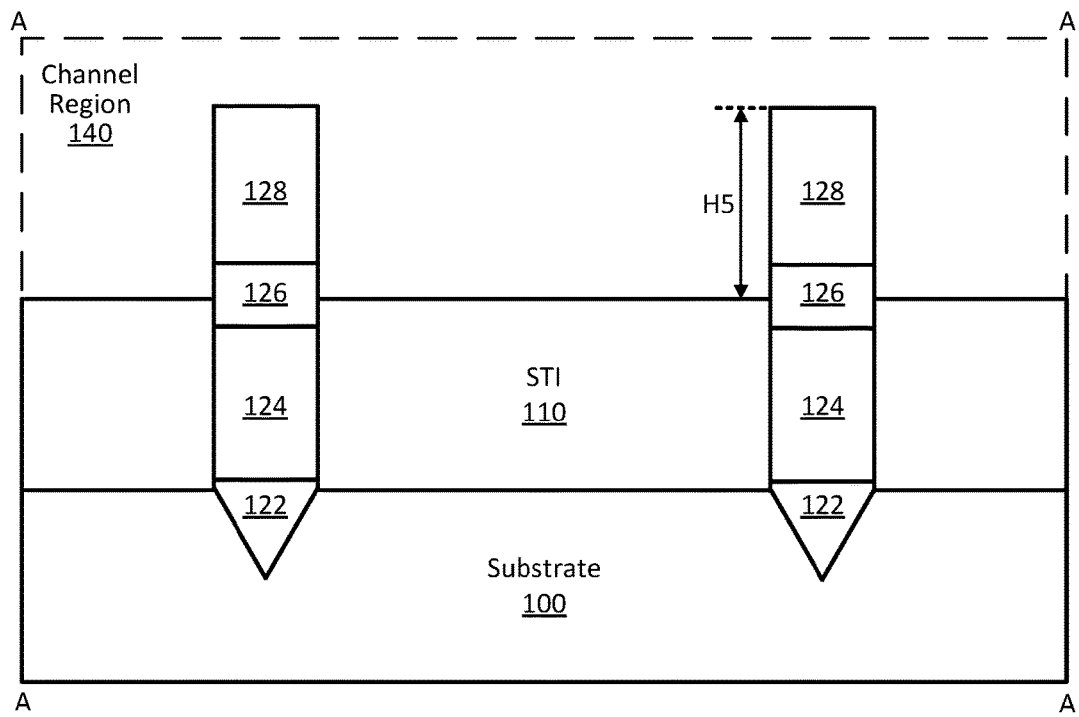

FIG. 1I is a cross-sectional view taken along plane A of FIG. 1H, in accordance with an embodiment. FIG. 1I is provided to illustrate the channel region of the structure of FIG. 1H. As can be seen, the structure includes an active fin portion having a height H5 and a sub-fin portion that is below the top of the STI 110 plane. Such a structure may be used for a finned transistor configuration, where the gate stack is formed on and adjacent to the active fin portion, in an example embodiment.

Figure 2A:
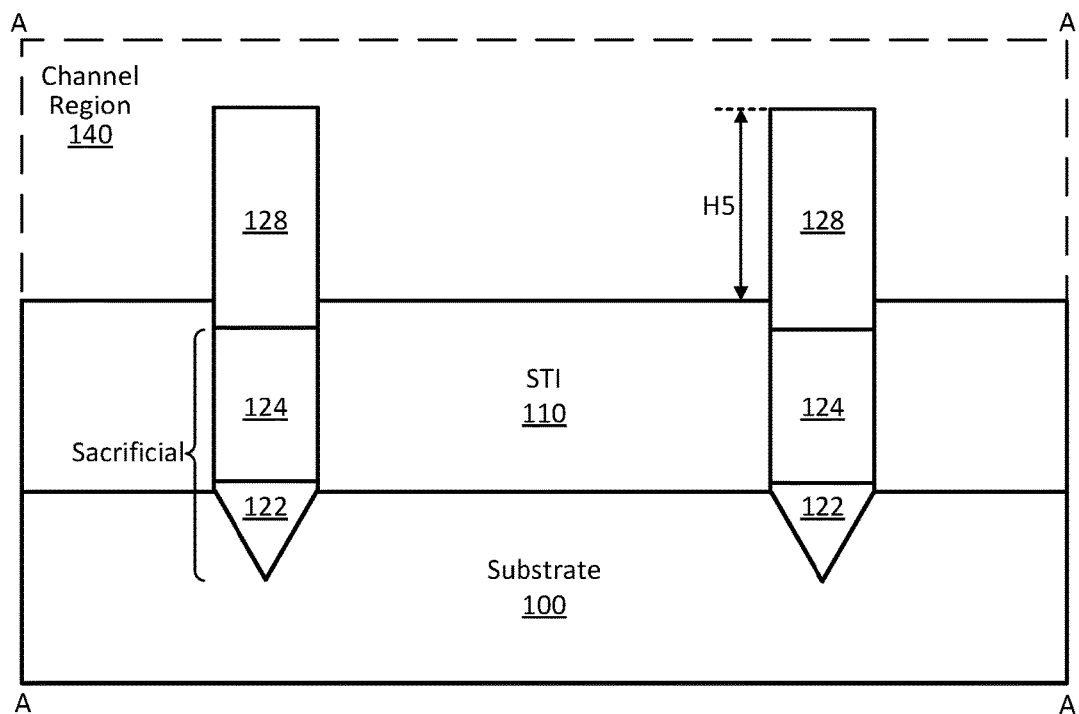
FIGS. 2A-C' illustrate example integrated circuit structures resulting from a method configured to form gate-all-around (GAA) configuration transistors including tensile-strained Ge channel material, in accordance with some embodiments of this disclosure. Note that FIG. 2A is a cross-sectional view taken along plane A of FIG. 1H and including the fin materials of FIG. 1F', in accordance with some embodiments. Also note that FIGS. 2B-C are also cross-section views taken along plane A of FIG. 1H, in accordance with some embodiments. Further note that FIGS. 2B' and 2C' are provided to illustrate example structures that may be used to form a transistor including two tensile-strained Ge material nanowires, in accordance with some embodiments.

FIG. 2A is a cross-sectional view taken along plane A of FIG. 1H and including the fin materials of FIG. 1F', in accordance with an embodiment. Recall that in this example embodiment, CBO layer 126 is not present, as III-V material layers 122 and 124 are intended to be sacrificial layers to be etched out and removed to form one or more nanowires, as will be described in more detail below. Also recall that nucleation layer 122 is optional, and thus in some embodiments, it may not be present. As can be seen in FIG. 2A, the structure includes a portion above the top of the STI 110 plane having a height H5 and a sub-fin portion that is below the top of the STI plane. Comparing the example structure of FIG. 1I to the example structure of FIG. 2A, it can be seen that all of Ge layer 128 is exposed (above the top of STI 110 plane) in FIG. 1I, while a portion of Ge layer 128 is located below the top of STI 110 plane, which can help keep the interface of Ge layer 128 and the sub-fin (or underlying layers) clean (such as better surface quality) until the sub-fin is actually released.

Figure 2B:
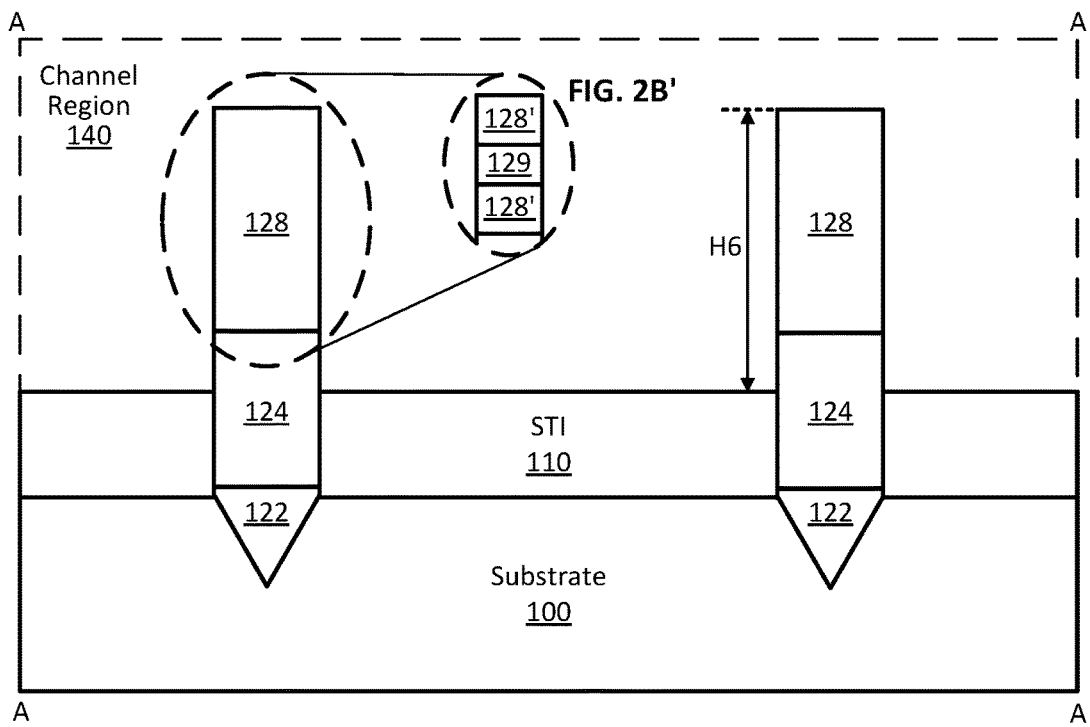

FIG. 2B illustrates an example structure after the STI 110 of FIG. 2A is recessed such that a portion of the previous sub-fin region is exposed, in accordance with an embodiment. This enables a selective etch (e.g., wet and/or dry) to be performed and form the example structure of FIG. 2C, in accordance with an embodiment. In some embodiments, the selective etch may include an etch process that removes the III-V material (e.g., of layers 124 and 122) at a rate of at least 1.5, 2, 3, 4, 5, 10, 100, or 1000 times faster relative to the removal of Ge (e.g., of Ge layer 128) for a given etchant (and suitable selective etchants can be understood in light of the present disclosure). Note that in some embodiments, more than one etch process may be performed, for example. In some such embodiments, any suitable etchant and/or etch conditions may be used to achieve the desired selectivity of the process. As can also be seen in FIG. 2C, fin trenches 153 and 155 are formed in the STI 110 and substrate 100 as a result of removal of the group III-V material layers (e.g., as a result of the removal of layers 122 and 124, in this example embodiment). In this example embodiment, fin trenches 153 and 155 are formed below Ge material layer 128 (which is targeted to be used as the transistor channel) and in substrate 100. Recall that the bottom of fin trenches 153 and 155 may have various different shapes (e.g., as shown in FIGS. 1C' and 1C"), depending on the etch process used to form fin trenches 103 and 105. In addition, in some embodiments, the etch process used to remove the group III-V material layers from the structure of FIG. 2B may also remove a portion of the substrate 100 material, as substrate 100 may also include, for example, group III-V material (or other material that may be removed by the etchant used during the etch process). Therefore, in some such embodiments, the etch may begin to remove substrate 100 material in fin trenches 153 and 155 and such fin trenches may take on a different shape. Note that in some embodiments, the etch process to remove the group III-V material may not completely remove the group III-V material, such that some remaining group III-V material may be in fin trenches 153, 155, for example.

Figure 2C:
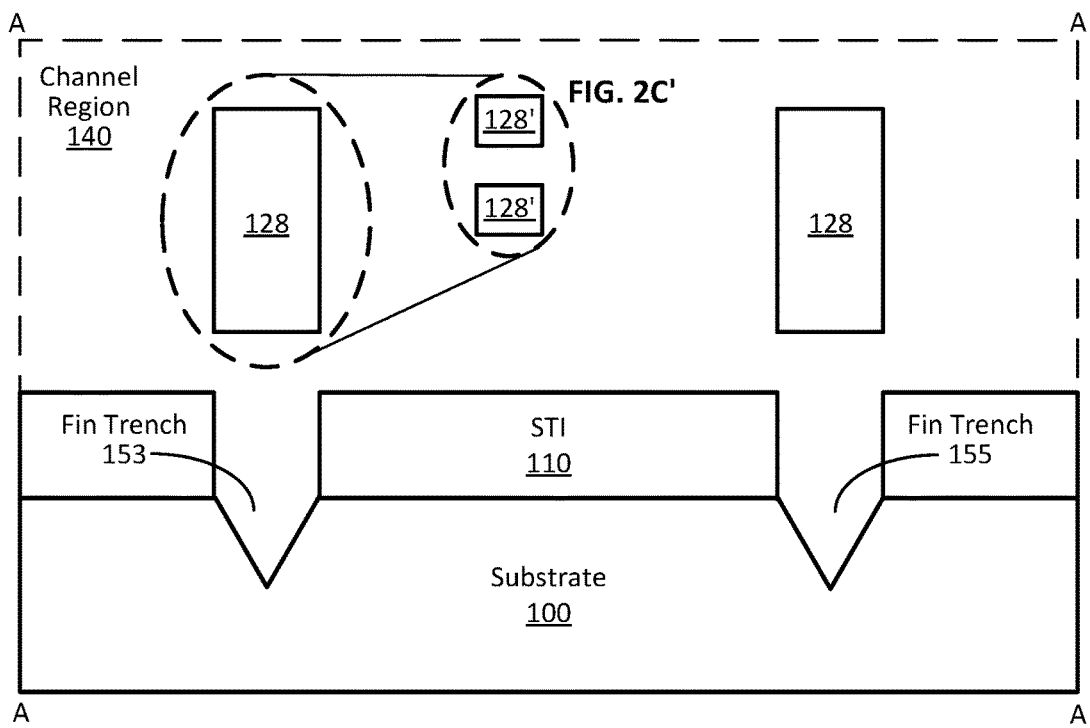

As can be seen in FIG. 2C, the sub-fin material (including SRB layer 124 and nucleation layer 122) has been selectively removed, leaving Ge layer 128 which may be held in place by spacers 136 on either side of the layer 128, for example. As can be understood based on this disclosure, FIG. 2C illustrates a gate-all-around transistor configuration, where a single nanowire/nanoribbon 128 is formed. FIGS. 2B' and 2C' are provided to illustrate an embodiment including two nanowires/nanoribbons, which may be formed by stacking a sacrificial material 129 (e.g., a III-V material layer) between two sections of Ge layer 128', for example. In such an embodiment, when layers 122 and 124 are etched and removed to form the structure of FIG. 2C, the process may also remove sacrificial layer 129, thereby leaving the two nanowires/nanoribbons 128' suspended in place by spacers 136 on either side of the material 128', for example, as shown in FIG. 2C'. In some embodiments, sacrificial layer 129 may be removed using any suitable techniques. In some embodiments, layer 129 may be left in the end structure as an interfacial layer between the two nanowires/nanoribbons (e.g., an insulating layer). In some such embodiments, the gate material may substantially wrap around the two or more nanowires, as opposed to individually wrapping around each one, for example. In some embodiments, any number of nanowires/nanoribbons (e.g., 1, 2, 3, 4, 5, 6, and so forth) may be formed form the channel region of a GAA transistor, using the techniques described herein. In some embodiments In some embodiments, where one or more nanowires or nanoribbons are formed for a transistor including a gate-all-around configuration, the tension or tensile strain in the Ge channel layer 128/128' may be lost when the underlying layer (e.g., SRB layer 124) is etched away. Recall that in some embodiments, SRB layer 124 provided a material layer having a higher lattice constant than the Ge-containing layer 128, thereby causing tensile strain in Ge layer 128 when growing the layer. Thus, removal of the underlying III-V material layer (e.g., SRB layer 124) may cause Ge layer 128 (to be used for the transistor channel) to relax and lose some or all of its tensile strain, in some embodiments. In some such embodiments, to re-apply the tensile strain in the Ge layer 128, a macroscopic 3-point bending technique may be applied to the dies containing the transistor structures. In some embodiments, such a 3-point bending may be performed at the end of line (EOL), for example. In some embodiments, the 3-point bending techniques may include application of pressure (e.g., in the range of 1 to 5 MPa) during the packaging process to create a radius of curvature to the die. In some such embodiments, the direction of curvature may be selected such that the fins or nanowires/nanoribbons are put in tension or compression as desired to increase the carrier mobility for the species of interest. Further, in some such embodiments, the bending can be preserved or memorized in the packaging material for the life of the device. In some embodiments, the tensile strain in the Ge nanowires/nanoribbons may be observed by testing whether the packaging includes a radius of curvature element. This may include taking a cross section of the package and looking for a non-planar die-in-package. In such cases, the strain can be calculated by knowing the radius of curvature and the thickness of the beam element, for example. Even in the absence of packaging, the strain may be inferred based on geometry and known elastic constants, for example. A tensile-strained Ge GAA transistor may have its mobility enhanced compared to unstrained Ge GAA transistors, which can be detected using an e-test, for example. In some embodiments, the techniques described herein used to form a transistor having a gate-all-around configuration may result in unused fins on the same die as the transistor being formed, where such unused fins include the structure of FIG. 2A, for example, or more generally, a fin including a tensile-strained Ge layer on one or more III-V material layers.

Figure 3:
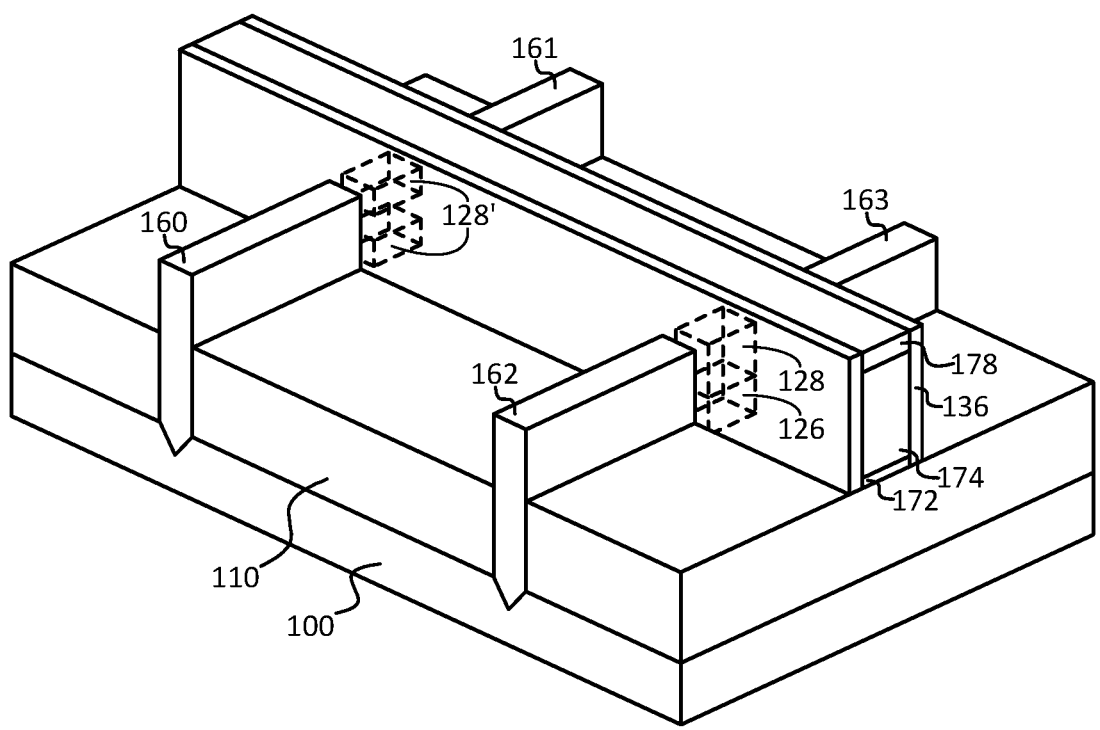
FIG. 3 illustrates an integrated circuit including finned and gate-all-around transistor configurations including tensile-strained Ge channel material, in accordance with some embodiments of this disclosure.

FIG. 3 illustrates an integrated circuit including finned and gate-all-around transistor configurations including tensile-strained Ge channel material, in accordance with some embodiments. As can be seen in the example structure of FIG. 3, channel region 140 has been filled in with a gate stack including gate dielectric 172 and gate electrode 174. Hardmask 178 is also formed on the gate stack, in this example case, to protect the gate stack during other processes, such as during the source/drain processing. In some embodiments, gate dielectric 172 and gate electrode 174 may be formed using any suitable techniques. In some embodiments, the gate stack (including gate dielectric 172 and gate 174) may wrap at least substantially around each of the nanowires/nanoribbons (e.g., single nanowire 128 or double nanowires 128'), where the gate dielectric material is between the gate material and the nanowire/nanoribbon material (e.g., the Ge material of layers 128/128'). In some such embodiments, at least substantially around may include around at least 50, 60, 70, 80, 90, or 95% of the outer surface of each nanowire/nanoribbon. In some embodiments, variations that may prevent the gate stack from completely wrapping around the gate stack may be formed during a desired process or may occur as a result of real-world fabrication processes, for example.

In some embodiments, gate dielectric 172 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 172 to improve its quality when a high-k material is used, for example. In some embodiments, the material of gate or gate electrode 174 may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, one or more work-function material layers may be formed between the gate dielectric 172 and gate 174 to, for example, increase the interface quality between the gate dielectric 172 and the gate 174 and/or to improve the electrical properties between the gate dielectric 172 and the gate 174. In some embodiments, gate dielectric layer 172 and/or gate 174 may include a multi-layer structure of two or more material layers. In some embodiments, gate dielectric layer 172 and/or gate 174 may include grading (e.g., increasing and/or decreasing) the content of one or more materials in at least a portion of the layer.

As can also be seen in FIG. 3, source/drain processing was performed to form source/drain regions 160/161 and 162/163, in this example embodiment. Further, as shown in FIG. 3, source/drain regions 160/161 are adjacent to the gate-all-around channel region 128' (including two nanowires/nanoribbons) and source/drain regions 162/163 are adjacent to the finned channel region 128/126 (including Ge layer 128 and CBO layer 126). Any number of additional processes may be performed to complete the formation of one or more transistor devices, such as forming source/drain contacts and performing back-end-of line interconnections, for example. In some embodiments, the source/drain processing may include patterning and filling the source/drain regions with appropriately doped (or undoped, in some cases) epitaxial materials. In some embodiments, the source/drain epitaxial regions may be grown after performing an etch-under-cut (EUC) process. In some such embodiments, the source/drain regions may extend under spacers 136 and/or under the gate stack, and such extended portions may be referred to as source/drain tips or extensions, for example. In some embodiments, the source/drain may be completely in the substrate, may be a portion of the substrate (e.g., including doping or otherwise altered), may be over the substrate, or any combination thereof. In some embodiments, source/drain regions 160/161 and 162/163 may include any suitable materials and, optionally, any suitable dopants, depending on the end use or target application. Further, in some embodiments, the source/drain regions may include grading (e.g., increasing and/or decreasing) the content of one or more materials in at least one of the regions. Further yet, in some embodiments, one or more of the layers included in the source/drain regions may be a multi-layer structure including at least two material layers, depending on the end use or target application.

In the example structure of FIG. 3, the left transistor (including nanowires 128') may be a p-MOS device, in some devices, and source/drain regions 160/161 may both be doped with a p-type dopant. In another example embodiment, the right transistor (including finned channel region 128) may be an n-MOS device, and source/drain regions 162/163 may both be doped with an n-type dopant. Further, in embodiments where one of the transistors is a p-MOS device and the other is an n-MOS device, they may both be included in a CMOS device, for example. Note that in such a CMOS device, the transistors may be located farther apart than what is shown in FIG. 3 and/or include additional isolation material between the two transistors, for example. Further note that the transistors in such a CMOS device configuration may not share the same gate stack, for example. In some embodiments, any suitable source/drain material and optional doping schemes may be used, depending on the end use or target application. For example, in TFET configurations, the source/drain regions may be oppositely type doped (e.g., source is p-type doped and drain is n-type doped, or vice versa), with the channel region being minimally doped or undoped (or intrinsic/i-type). The two different configurations including different channel geometries are both provided in the example structure of FIG. 3 for ease of illustration. In some embodiments, a single integrated circuit may include transistors having all the same configuration (and optionally have varying n or p-type structures) or two or more different configurations (and optionally have varying n or p-type structures).

As can be understood based on the present disclosure, in some embodiments, a transistor (or other integrated circuit layers, structures, features, or devices) formed using the techniques described herein may be formed at least one of above and on the substrate 100, as various portions of the transistor (or other integrated circuit layers, structures, features, or devices) may be formed on the substrate (e.g., the source/drain regions 160/161 and 162/163), various portions may be formed above the substrate (e.g., nanowires 128'), and various portions may be considered to be both on and above the substrate, for example. Note that forming a layer/structure/feature/device on the substrate 100 as used herein is inclusive of forming that layer/structure/feature/device in the substrate 100 (e.g., where the feature is at least partially sandwiched between substrate 100 material), as the layer/structure/feature/device is also on the substrate. For example, in the structure of FIG. 3, the source/drain regions 160/161 and 162/163 are illustrated as at least partially in the substrate 100 (e.g., where the bottom faceted portion extends into the substrate 100 material), but the source/drain regions 160/161 and 162/163 are also on the substrate 100 (e.g., as the bottom surfaces of the regions are on the substrate 100 material). Numerous variations and configurations will be apparent in light of this disclosure.

Example System

Figure 4:
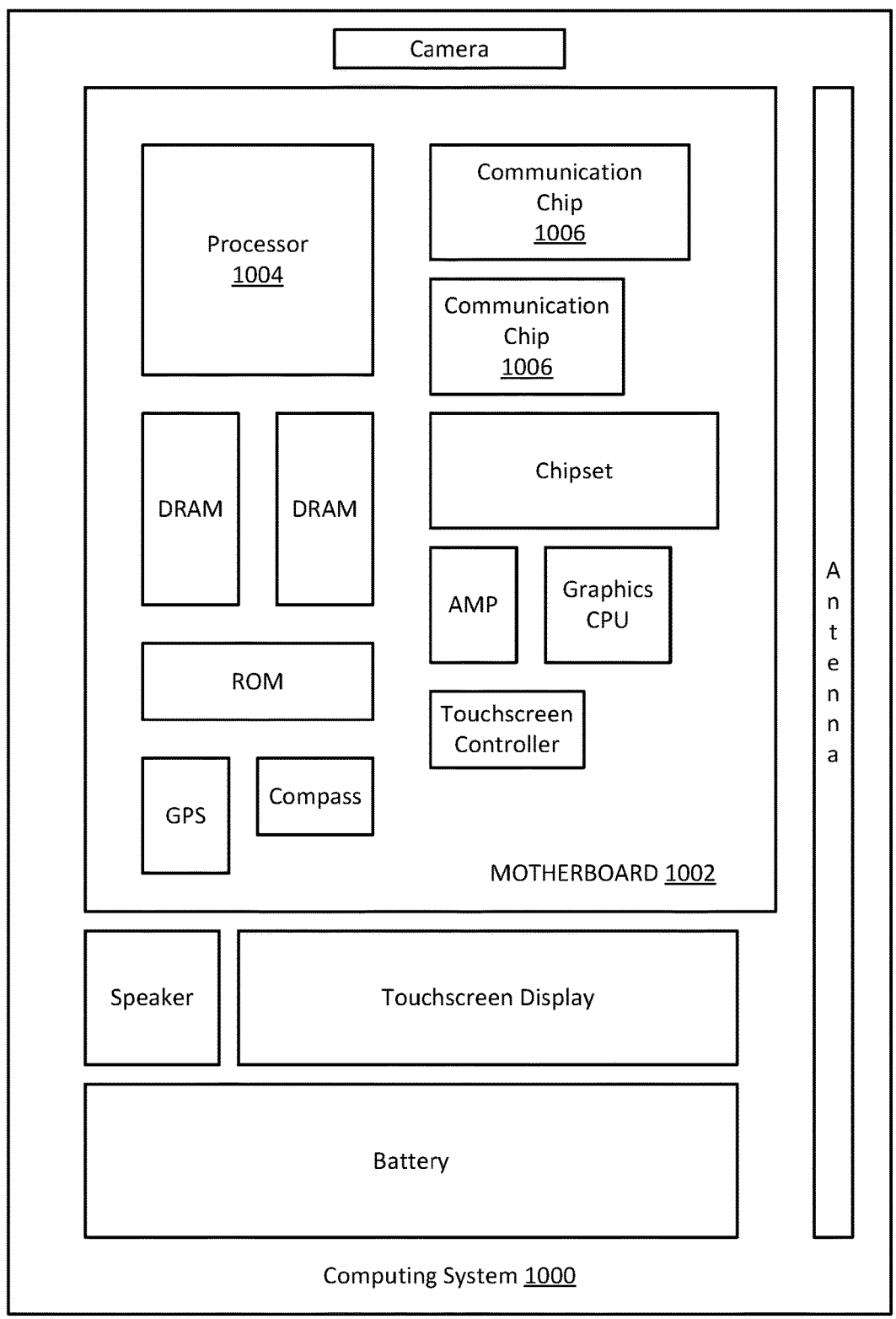
FIG. 4 illustrates a computing system implemented with integrated circuit structures or devices formed using the techniques disclosed herein, in accordance with some embodiments of this disclosure.

FIG. 4 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a substrate; a channel region formed at least one of above and on the substrate, the channel region including tensile-strained germanium; a gate above the channel region; and source and drain regions adjacent to the channel region.

Example 2 includes the subject matter of Example 1, further including at least one group III-V material layer below the channel region.

Example 3 includes the subject matter of any of Examples 1-2, further including a buffer layer below the channel region, wherein the buffer layer includes at least one of indium gallium arsenide, indium arsenide, and gallium arsenide.

Example 4 includes the subject matter of Example 3, wherein the buffer layer includes a higher lattice constant than the channel region.

Example 5 includes the subject matter of any of Examples 3-4, wherein the buffer layer is a strain-relaxed buffer layer.

Example 6 includes the subject matter of any of Examples 3-5, further including a pseudomorphic layer between the channel region and the buffer layer.

Example 7 includes the subject matter of Example 6, wherein the pseudomorphic layer includes a conduction band offset of at least 0.25 meV relative to the channel region.

Example 8 includes the subject matter of any of Examples 6-7, wherein the pseudomorphic layer includes at least one of indium phosphide, gallium phosphide, gallium arsenide, indium aluminum arsenide, aluminum gallium arsenide, indium aluminum gallium arsenide, gallium arsenide antimonide, and aluminum gallium phosphide.

Example 9 includes the subject matter of any of Examples 3-8, further including a nucleation layer below the buffer layer.

Example 10 includes the subject matter of Example 9, wherein the nucleation layer includes at least one of indium phosphide, gallium phosphide, gallium arsenide, indium aluminum arsenide, aluminum gallium arsenide, indium aluminum gallium arsenide, gallium arsenide antimonide, and aluminum gallium phosphide.

Example 11 includes the subject matter of any of Examples 1-10, wherein the transistor includes a finned configuration.

Example 12 includes the subject matter of any of Examples 1-2, wherein the transistor includes a gate-all-around configuration.

Example 13 includes the subject matter of any of Examples 1-12, wherein the transistor is one of a p-type and n-type transistor.

Example 14 includes the subject matter of any of Examples 1-13, wherein the transistor is one of a metal-oxide-semiconductor field-effect-transistor (MOSFET) and tunnel FET (TFET) transistor.

Example 15 is a complementary metal-oxide-semiconductor (CMOS) device including the subject matter of any of Examples 1-14.

Example 16 is a complementary tunnel field-effect-transistor (CTFET) device including the subject matter of any of Examples 1-14.

Example 17 is a computing system including the subject matter of any of Examples 1-16.

Example 18 is an integrated circuit including: a substrate; an n-type transistor formed on the substrate and including a first channel region formed at least one of above and on the substrate, wherein the first channel region comprises tensile-strained germanium; and a p-type transistor formed on the substrate and including a second channel region formed at least one of above and on the substrate, wherein the second channel region comprises tensile-strained germanium.

Example 19 includes the subject matter of Example 18, further including at least one group III-V material layer below at least one of the first and second channel regions.

Example 20 includes the subject matter of any of Examples 18-19, further including a buffer layer below at least one of the first and second channel regions, wherein the buffer layer includes at least one of indium gallium arsenide, indium arsenide, and gallium arsenide.

Example 21 includes the subject matter of Example 20, wherein the buffer layer includes a higher lattice constant than the at least one channel region the strain-relaxed buffer layer is below.

Example 22 includes the subject matter of any of Examples 20-21, wherein the buffer layer is a strain-relaxed buffer layer.

Example 23 includes the subject matter of any of Examples 20-22, further including a pseudomorphic layer between the at least one channel region and the buffer layer.

Example 24 includes the subject matter of Example 23, wherein the pseudomorphic layer includes a conduction band offset of at least 0.25 meV relative to the at least one channel region the pseudomorphic layer is below.

Example 25 includes the subject matter of any of Examples 23-24, wherein the pseudomorphic layer includes at least one of indium phosphide, gallium phosphide, gallium arsenide, indium aluminum arsenide, aluminum gallium arsenide, indium aluminum gallium arsenide, gallium arsenide antimonide, and aluminum gallium phosphide.

Example 26 includes the subject matter of any of Examples 20-25, further including a nucleation layer below the buffer layer.

Example 27 includes the subject matter of Example 26, wherein the nucleation layer includes at least one of indium phosphide, gallium phosphide, gallium arsenide, indium aluminum arsenide, aluminum gallium arsenide, indium aluminum gallium arsenide, gallium arsenide antimonide, and aluminum gallium phosphide.

Example 28 includes the subject matter of any of Examples 18-27, wherein at least one of the n-type and p-type transistors includes a finned configuration.

Example 29 includes the subject matter of any of Examples 18-19, wherein at least one of the n-type and p-type transistors includes a gate-all-around configuration.

Example 30 includes the subject matter of any of Examples 18-29, wherein at least one of the n-type and p-type transistors is one of a metal-oxide-semiconductor field-effect-transistor (MOSFET) and tunnel FET (TFET) transistor.

Example 31 is a complementary metal-oxide-semiconductor (CMOS) device including the subject matter of any of Examples 18-30.

Example 32 is a complementary tunnel field-effect-transistor (CTFET) device including the subject matter of any of Examples 18-30.

Example 33 is a computing system including the subject matter of any of Examples 18-32.

Example 34 is a method of forming a transistor, the method including: forming a fin on a substrate; forming shallow trench isolation (STI) material on either side of the fin; removing at least a portion of the fin to form a fin trench; and forming a replacement fin stack in the fin trench, the replacement fin stack including a first layer including germanium and a second layer including a group III-V material, wherein the first layer is above the second layer.

Example 35 includes the subject matter of Example 34, wherein the fin is native to the substrate.

Example 36 includes the subject matter of any of Examples 34-35, further including recessing the STI material such that a portion of the replacement fin stack protrudes above the STI material.

Example 37 includes the subject matter of any of Examples 34-36, further including forming a third layer in the replacement fin stack including a group III-V material between the first and second layers, wherein the third layer has a conduction band offset with respect to the first layer of at least 0.25 meV.

Example 38 includes the subject matter of any of Examples 34-36, further including removing the second layer using an etch process.

Example 39 includes the subject matter of Example 38, wherein the second layer is removed using a wet etch process including an etchant that selectively removes the group III-V material relative to the germanium material.

Example 40 includes the subject matter of any of Examples 38-39, wherein removing the second layer using an etch process is performed only in a channel region of the replacement fin stack.

Example 41 includes the subject matter of any of Examples 34-40, further including forming a gate above a portion of the replacement fin stack.

Example 42 includes the subject matter of any of Examples 34-41, further including applying macroscopic 3-point bending to the transistor.

Example 43 includes the subject matter of any of Examples 34-42, wherein the transistor is one of a p-type and n-type transistor.

Example 44 includes the subject matter of any of Examples 34-43, further including forming a complementary metal-oxide-semiconductor (CMOS) device, wherein the first layer is used as a transistor channel.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
   a substrate;
   a first transistor comprising
      a first body above the substrate, the first body including tensile-strained semiconductor material that includes germanium,
      a first gate structure at least above the first body, the first gate structure including one or more metals, and a first source region and a first drain region, the first body between the first source and drain regions, the first source and drain regions including semiconductor material and n-type dopant; and a second transistor comprising a second body above the substrate, the second body including tensile-strained semiconductor material that includes germanium, a second gate structure at least above the second body, the second gate structure including one or more metals, and a second source region and a second drain region, the second body between the second source and drain regions, the second source and drain regions including semiconductor material and p-type dopant.

2. The integrated circuit of claim 1, wherein the tensile-strained semiconductor material included in one or both of the first body or the second body is germanium.

3. The integrated circuit of claim 1, further comprising a complementary metal-oxide-semiconductor (CMOS) device comprising the first and second transistors.

4. The integrated circuit of claim 1, wherein the first body is a nanowire or a nanoribbon.

5. The integrated circuit of claim 1, wherein the second body is a nanowire or a nanoribbon.

6. The integrated circuit of claim 1, wherein the first body is a fin, the fin between two portions of the first gate structure.

7. The integrated circuit of claim 1, wherein the first gate structure is around the first body.

8. A computing system comprising the integrated circuit of claim 1.

9. The integrated circuit of claim 1, further comprising a layer below the first source and drain regions, the layer also below the second source and drain regions, wherein the layer includes group III-V semiconductor material.

10. The integrated circuit of claim 9, wherein the layer is also below the first and second bodies.

11. The integrated circuit of claim 9, wherein the layer extends under the first body and under the second body, wherein the layer is continuous from the first source region to the first drain region and the layer is also continuous from the second source region to the second drain region.

12. The integrated circuit of claim 9, wherein the group III-V semiconductor material included in the layer includes arsenic.

13. The integrated circuit of claim 9, wherein the group III-V semiconductor material included in the layer has a higher lattice constant than the semiconductor material included in the first body and/or the second body.

14. The integrated circuit of claim 9, wherein the layer is a strain-relaxed buffer layer.

15. The integrated circuit of claim 9, further comprising an additional layer between the first body and the layer, the additional layer including group III-V semiconductor material, the additional layer having a thickness lower than a critical thickness of the group III-V semiconductor material included in the additional layer.

16. The integrated circuit of claim 15, wherein the semiconductor material included in the additional layer includes a conduction band offset of at least 0.25 millielectronvolts relative to the group III-V semiconductor material included in the first body and/or the second body.

17. The integrated circuit of claim 15, wherein the group III-V semiconductor material included in the additional layer includes indium or gallium, or both indium and gallium.

18. The integrated circuit of claim 9, further comprising an additional layer between the layer and an underlying substrate, the additional layer including group III-V semiconductor material.

19. The integrated circuit of claim 18, wherein the group III-V semiconductor material included in the additional layer includes indium or gallium, or both indium and gallium.

* * * * *